US012676197B2

(12) United States Patent
Chang

(10) Patent No.: US 12,676,197 B2
(45) Date of Patent: Jul. 7, 2026

(54) DATA STORAGE DEVICE AND CONTROL METHOD FOR NON-VOLATILE MEMORY

(71) Applicant: Silicon Motion, Inc., Jhubei City (TW)

(72) Inventor: Wen-Chun Chang, Zhubei City (TW)

(73) Assignee: SILICON MOTION, INC., Jhubei City (TW)

( * ) Notice: Subject to any disclaimer, the term of this patent is extended or adjusted under 35 U.S.C. 154(b) by 233 days.

(21) Appl. No.: 18/746,496

(22) Filed: Jun. 18, 2024

(65) Prior Publication Data

US 2024/0428867 A1      Dec. 26, 2024

Related U.S. Application Data

(60) Provisional application No. 63/509,041, filed on Jun. 20, 2023.

(51) Int. Cl.
*G11C 7/04* (2006.01)
*G11C 16/26* (2006.01)
*G11C 16/32* (2006.01)
*G11C 16/34* (2006.01)

(52) U.S. Cl.
CPC .............. *G11C 16/32* (2013.01); *G11C 16/26* (2013.01); *G11C 16/3418* (2013.01)

(58) Field of Classification Search
CPC ........................................................ G11C 7/04
See application file for complete search history.

(56) References Cited

U.S. PATENT DOCUMENTS

2013/0135782 A1*   5/2013   Roth ........................ G01K 7/16
                                                   361/103
2021/0103407 A1*   4/2021   Na ........................ G06F 3/0679
2021/0165442 A1    6/2021   Jung

FOREIGN PATENT DOCUMENTS

CN        104424988 A      3/2015
TW        I396974 B        5/2013
TW        I676171 B        11/2019
TW        202213112 A      4/2022

* cited by examiner

*Primary Examiner* — Hoai V Ho
(74) *Attorney, Agent, or Firm* — McClure, Qualey & Rodack, LLP

(57)      ABSTRACT

A data storage device is adaptively adjusted according to the sensed temperature. The data storage device has a first clock generator and a second clock generator, respectively generating a first clock and a second clock, which are selected by a controller to operate a nonvolatile memory. In response to the sensed temperature not exceeding a first threshold temperature, the controller selects the first clock to operate the non-volatile memory. In response to the sensed temperature exceeding the first threshold temperature, the controller alternately selects the first clock and the second clock to operate the non-volatile memory.

15 Claims, 4 Drawing Sheets

DATA STORAGE DEVICE AND CONTROL METHOD FOR NON-VOLATILE MEMORY

CROSS REFERENCE TO RELATED APPLICATIONS

This application claims the benefit of U.S. Provisional Application No. 63/509,041, filed Jun. 20, 2023, the entirety of which is incorporated by reference herein.

This application claims priority of Taiwan Patent Application No. 113102232, filed on Jan. 19, 2024, the entirety of which is incorporated by reference herein.

BACKGROUND OF THE DISCLOSURE

Field of the Disclosure

The present invention relates to control technology for a data storage device.

Description of the Related Art

There are various forms of non-volatile memory (NVM) used for long-term data storage, such as flash memory, magnetoresistive random access memory (magnetoresistive RAM), ferroelectric RAM, resistive RAM, spin transfer torque-RAM (STT-RAM), and so on. These types of non-volatile memory may be used as the storage medium in a data storage device, for long-term data storage.

In this technical field, how to efficiently control non-volatile memory is an important issue.

BRIEF SUMMARY OF THE DISCLOSURE

This disclosure adaptively controls a non-volatile memory according to the sensed temperature.

A data storage device in accordance with an exemplary embodiment of the disclosure includes a non-volatile memory, a controller, a first clock generator, and a second clock generator. The controller is coupled to the non-volatile memory and configured to operate the non-volatile memory in response to host requests. The first clock generator and the second clock generator generate a first clock and a second clock, respectively, to be selected by the controller to operate the non-volatile memory. In response to the sensed temperature not exceeding the first critical temperature, the controller selects the first clock to operate the non-volatile memory. In response to the sensed temperature exceeding the first critical temperature, the controller alternately selects the first clock and the second clock to operate the non-volatile memory.

The aforementioned concepts are further used to implement the control method of non-volatile memory.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE DISCLOSURE

The following description enumerates various embodiments of the disclosure, but is not intended to be limited thereto. The actual scope of the disclosure should be defined according to the claims. The various blocks/modules mentioned below may be implemented by a combination of hardware, software, and firmware, and may also be implemented by special circuits. The various blocks/modules are not limited to being implemented separately, but can also be combined together to share certain functions.

A non-volatile memory for long-term data retention may be a flash memory, a magnetoresistive random access memory (magnetoresistive RAM), a ferroelectric RAM, a resistive RAM, a spin transfer torque-RAM (STT-RAM) and so on. The following discussion uses flash memory as an example, but is not limited thereto. The proposed technology may be applied to the other types of non-volatile memory.

Today's data storage devices often use flash memory as the storage medium for storing user data from the host. There are many types of data storage devices, including memory cards, universal serial bus (USB) flash devices, solid-state drives (SSDs), and so on. In another exemplary embodiment, a flash memory may be packaged with a controller to form a multiple-chip package called eMMC (embedded multimedia card).

A data storage device using a flash memory as a storage medium can be applied in a variety of electronic devices, including a smartphone, a wearable device, a tablet computer, a virtual reality device, etc. A processor of an electronic device may be regarded as a host that operates the data storage device equipped on the electronic device to access the flash memory within the data storage device.

A data center may be built with data storage devices using flash memories as the storage medium. For example, a server may operate an array of SSDs to form a data center. The server may be regarded as a host that operates the SSDs to access the flash memories within the SSDs.

The vehicle-mounted device may also use a flash memory for data storage. Various sensors in the vehicle system each may be regarded as a host end, which has a need to access the flash memory.

With the development of science and technology, a flash memory is getting smaller and smaller, and its speed is getting faster and faster, which may result in high temperature. For example, the secure digital (SD) card association has proposed various SD specifications (such as SD Express Card, Macro SD Express Card) to realize small memory devices, and uses the Peripheral Component Interconnect Express interface (PCIe) to transmit data at high speed, but it also involves thermal energy issues. This case adaptively controls the flash memory based on the sensed temperature, effectively cooling down with the balance of performance.

Figure 1:
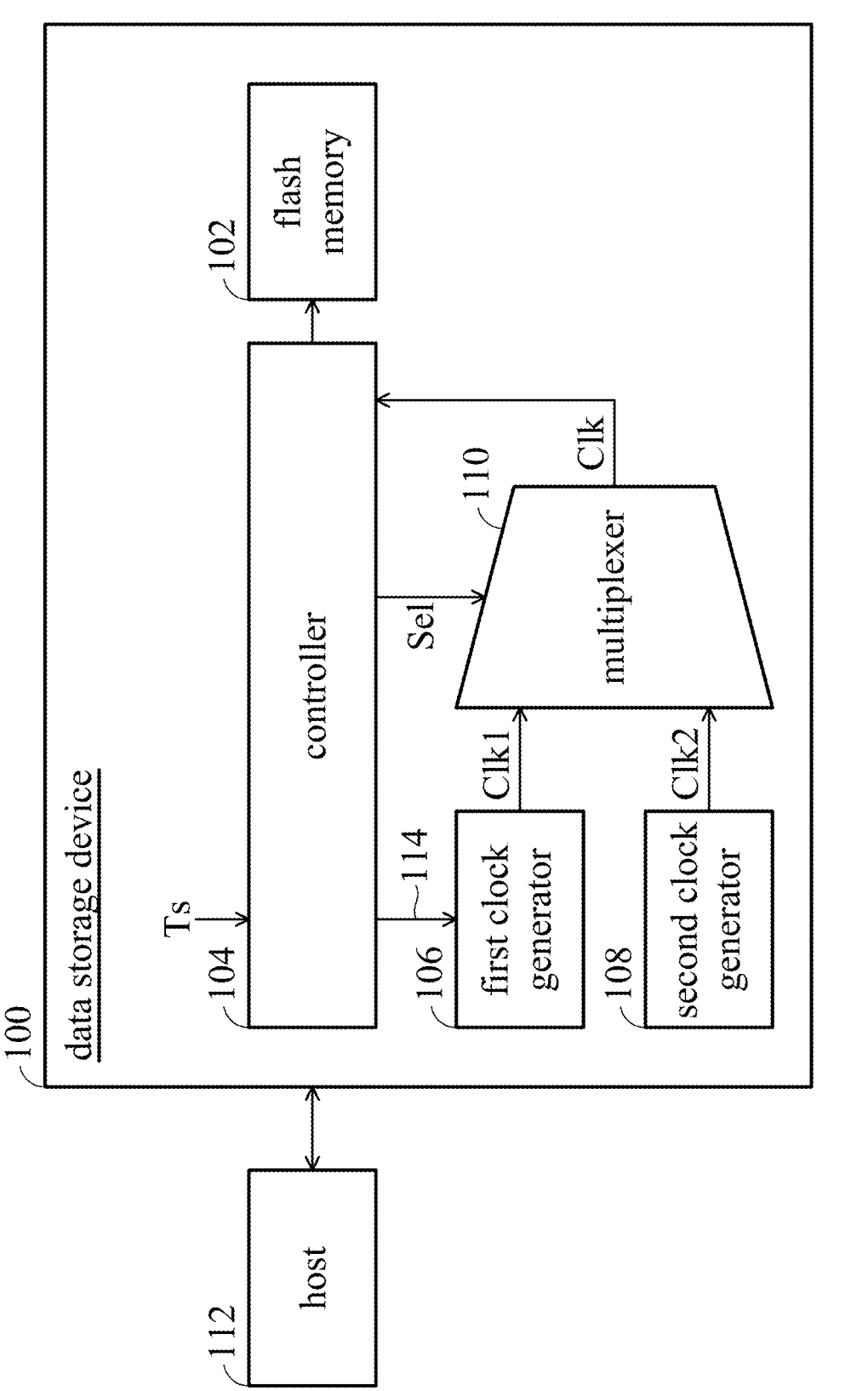
FIG. 1 illustrates a data storage device 100 in accordance with an exemplary embodiment of the present invention.

FIG. 1 illustrates a data storage device 100 in accordance with an exemplary embodiment of the present invention, including a flash memory 102, a controller 104, a first clock generator (e.g., a phase locked loop circuit abbreviated as PLL) 106, a second clock generator (e.g., oscillator, that may be a quartz oscillator) 108, and a multiplexer 110. The controller 104 is coupled to the flash memory 102 and configured to operate the flash memory 102 in response to the request from the host 112. The first clock generator 106 and the second clock generator 108 respectively generate a first clock Clk1 and a second clock Clk2. The multiplexer 110 is controlled by a selection signal Sel from the controller 104, to output the first clock Clk1 or the second clock Clk2 as the clock signal Clk for operating the flash memory 102. The frequency of the second clock Clk2 is lower than that of the first clock Clk1. For example, the first clock Clk1 may be as high as 1000 MHz or more, while the second clock Clk2 may be only tens of MHz. Based on the sensed temperature Ts, the controller 104 may use the signal 114 to disable the first clock generator 106. For example, the high-speed phase-locked loop (PLL) may be stopped to achieve the cooling effect significantly. The controller 104 selects the low-speed second clock Clk2 generated by the second clock generator 108 (for example, the oscillation signal generated by an oscillator) to wake up from its standby mode at any time, to cope with the interrupts issued by the host 112.

This case proposes an adaptive cooling strategy. In an exemplary embodiment, in response to the sensed temperature Ts not exceeding the first critical temperature (hereinafter TMTU), the controller 104 selects the first clock Clk1 to operate the flash memory 102. In response to the sensed temperature Ts exceeding the first critical temperature TMTU, the controller 104 alternately selects the first clock Clk1 and the second clock Clk2 to operate the non-volatile memory.

When enabling the first clock generator 106, the controller 104 selects the first clock Clk1 to operate the flash memory 102 to respond to the access request from the host 112; and this state is called a normal transmission status (hereinafter St). When the controller 104 disables the first clock generator 106, it selects the second clock Clk2 to operate the non-volatile memory 102 in a standby mode; this state is called a cooling state (hereinafter Sc). In an exemplary embodiment, in response to the sensed temperature Ts exceeding the first critical temperature TMTU, the controller 104 starts an adaptive cooling strategy: cyclically enabling and then disabling the first clock generator 106, to repeatedly switching between the normal transmission state St and the cooling state Sc. This design can effectively reduce the temperature without excessively reducing the performance of the device.

Figure 2:
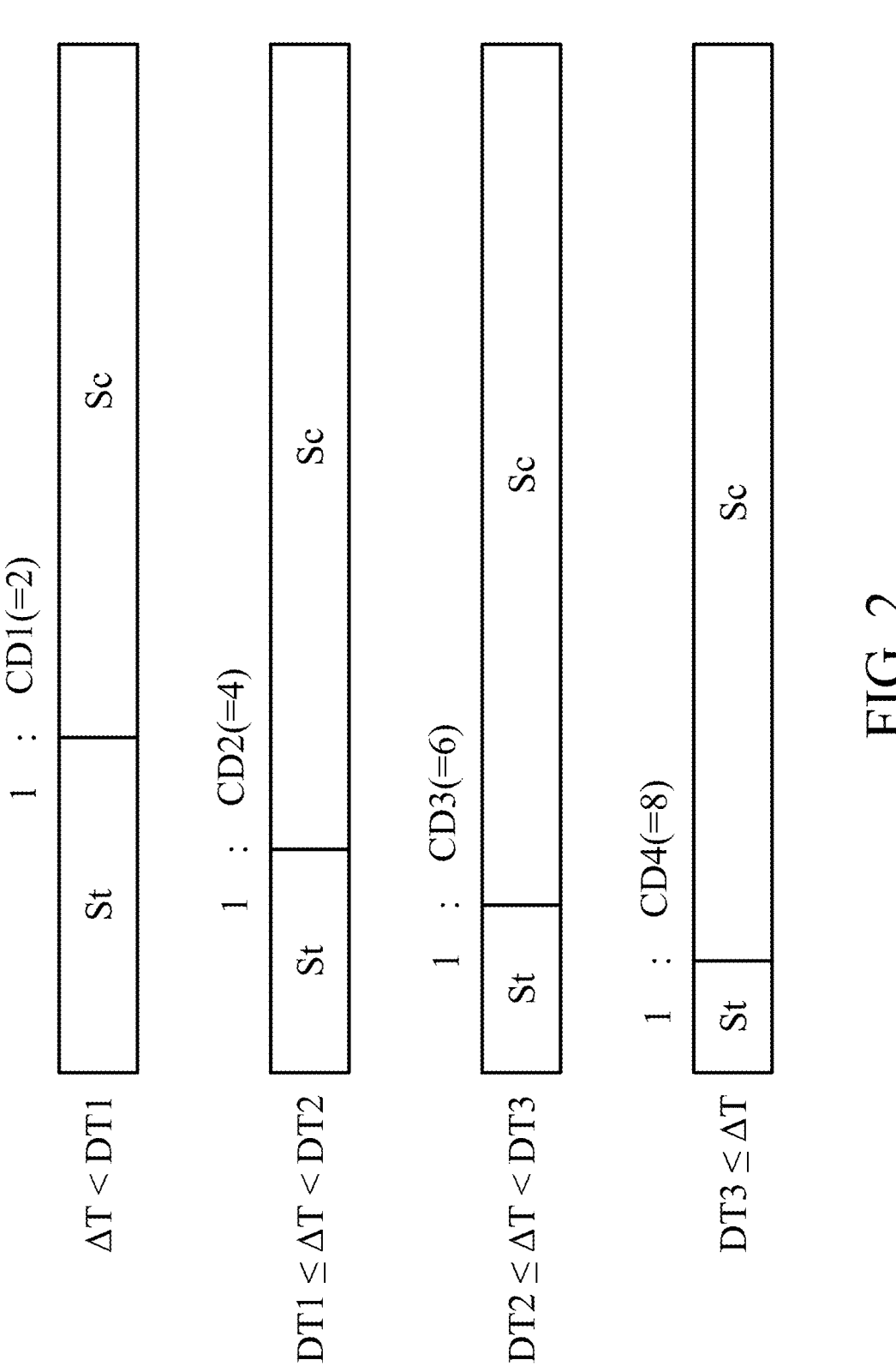
FIG. 2 illustrates the timing sequence of the adaptive cooling strategy, which shows how the adaptive cooling strategy is modified under the various temperature conditions.

FIG. 2 illustrates the timing sequence of the adaptive cooling strategy, which shows how the adaptive cooling strategy is modified under the various temperature conditions. Once the sensed temperature Ts exceeds the first critical temperature TMTU, the controller 104 performs the adaptive cooling strategy and repeatedly switches between the normal transmission state St and the cooling state Sc. In particular, the illustrated embodiment further shows that as the magnitude of the sensed temperature Ts exceeding the first critical temperature TMTU increases, the controller 104 disables the first clock generator 106 for a longer period of time.

In the figure, the numerical values DT1, DT2, and DT3 each show a temperature difference criteria. The numerical values CD1, CD2, CD3, and CD4 each represent a time proportion, where CD1<CD2<CD3<CD4. When the temperature difference ΔT (which is the sensed temperature Ts minus the first critical temperature TMTU) does not reach DT1, the controller 104 alternately enables (St) and disables (Sc) the first clock generator 106 with a time ratio of 1:CD1. When the temperature difference ΔT reaches the DT1 but does not reach the DT2, the controller 104 alternately enables (St) and disables (Sc) the first clock generator 106 with a time ratio of 1:CD2. When the temperature difference ΔT reaches the DT2 but does not reach the DT3, the controller 104 alternately enables (St) and disables (Sc) the first clock generator 106 with a time ratio of 1:CD3. When the temperature difference ΔT reaches the DT3, the controller 104 alternately enables (St) and disables (Sc) the first clock generator 106 with a time ratio of 1:CD4. In an example, DT1 is 5, DT2 is 10, DT3 is 15, CD1 is 2, CD2 is 4, CD3 is 6, and CD4 is 8. The illustration shows the adaptive cooling strategy is divided into four levels of control. In the other example, there may be a different number of control levels, other than four.

To summarize, in response to the sensed temperature Ts exceeding the first critical temperature TMTU, the controller 104 adjusts a time ratio of enabling the first clock Clk1 and the second clock Clk2 according to the magnitude that the sensed temperature Ts exceeds the first critical temperature TMTU.

In an exemplary embodiment, in response to the sensed temperature Ts not exceeding the first critical temperature TMTU, the controller 104 operates the flash memory 102 with underclocking according to a first clock Clk1 generated by the enabled first clock generator 106. Such an underclocking mode is different from the aforementioned standby mode achieved by the second clock Clk2. In the underclocking mode, the flash memory 102 is accessed as requested by the host 112 at the lower frequency.

In an exemplary embodiment, as the sensed temperature Ts increases closer to closer the first critical temperature TMTU, the controller 104 operates the flash memory 102 at a lower to lower frequency.

Figure 3:
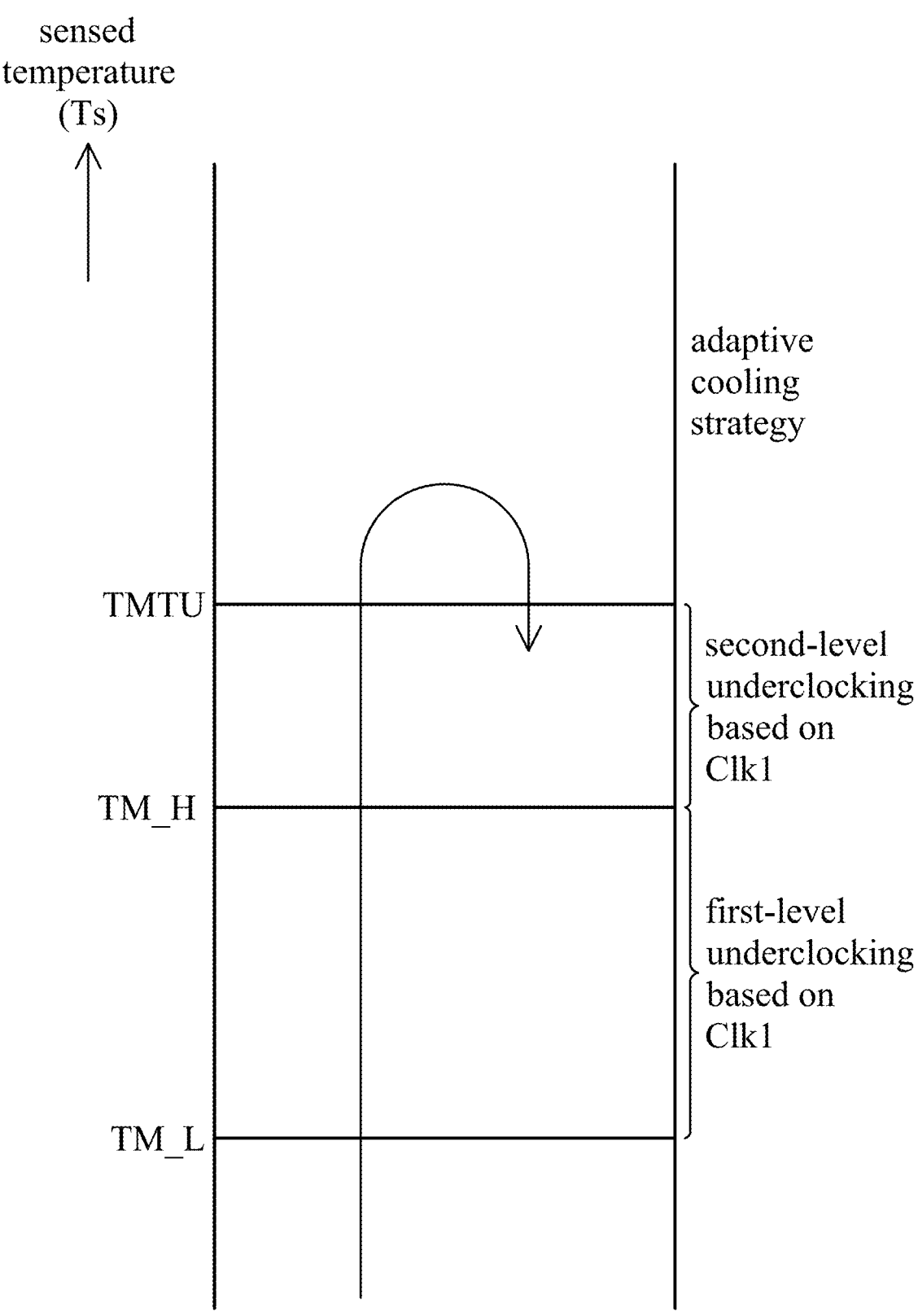
FIG. 3 illustrates temperature modulation control in accordance with an exemplary embodiment.

FIG. 3 illustrates temperature modulation control in accordance with an exemplary embodiment. In this example, in addition to the first critical temperature TMTU for initiating the adaptive cooling strategy, a second critical temperature TM_L and a third critical temperature TM_H are introduced, where TM_L<TM_H<TMTU. In response to the sensed temperature Ts exceeding the second critical temperature TM_L but not exceeding the third critical temperature TM_H, the controller 104 performs a first-level underclocking based on the first clock Clk1 generated by the first clock generator 106. Thus, the flash memory 102 is operated at a frequency reduction rate of N1, where N1 is a number less than 100. For example, the (100−N1) % frequency of the first clock Clk1 is used to create a third clock Clk3 to operate the flash memory 102. In particular, the third clock Clk3 may be higher than the second clock Clk2. In response to the sensed temperature Ts exceeding the third critical temperature TM_H but not exceeding the first critical temperature TMTU, the controller 104 performs a second-level underclocking based on the first clock Clk1 generated by the first clock generator 106. The flash memory 102 is operated at a frequency reduction rate of N2, where N2 is a number less than 100, but greater than N1. For example, the (100−N2) % frequency of the first clock Clk1 is used to create a fourth clock Clk4 to operate the flash memory 102. The fourth clock Clk4 is lower than the third clock Clk3 but higher than the second clock Clk2. In an exemplary embodiment, N1 is 30 and N2 is 70. The third clock Clk3 used in the first-level underclocking is 70% of the frequency of the first clock Clk1, and the fourth clock Clk4 used in the second-level underclocking is 30% of the frequency of the first clock Clk1.

FIG. 3 shows that when the temperature gradually rises, based on the first clock Clk1 generated by the first clock generator 106, the controller 104 first performs a first-level underclocking and then performs a second-level underclocking. When the temperature reaches the first critical temperature TMTU, the adaptive cooling strategy is activated. The controller 104 alternately enables and disables the first clock generator 106 in an adaptive ratio, to alternately switching between the normal transmission state St and the cooling state Sc in the adaptive ratio. This exemplary embodiment achieves effective cooling considering the performance.

Figure 4:
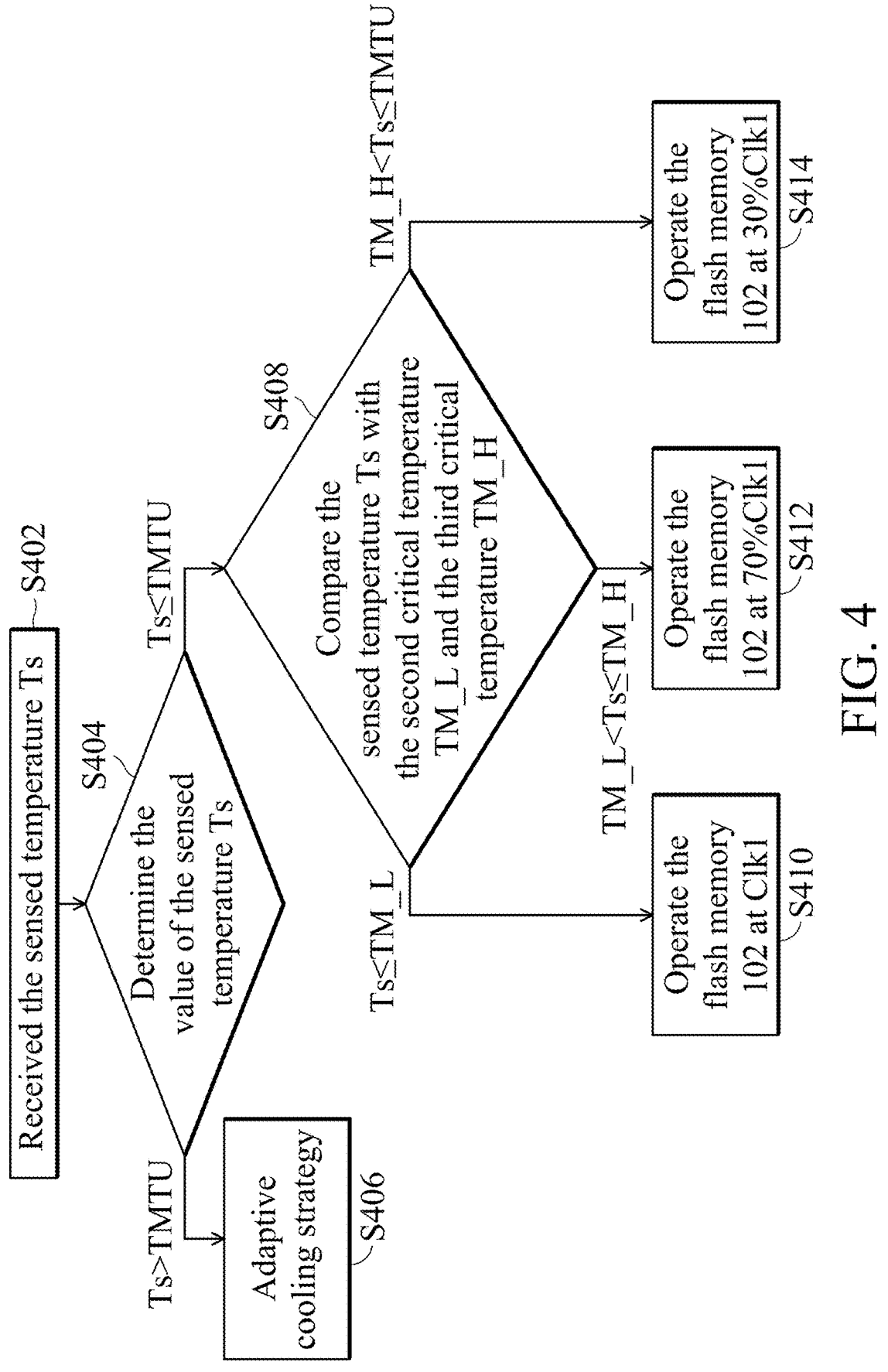
FIG. 4 illustrates the temperature control of the data storage device 100 in accordance with an exemplary embodiment of the disclosure.

FIG. 4 illustrates the temperature control of the data storage device 100 in accordance with an exemplary embodiment of the disclosure. In step S402, the temperature Ts is sensed. In step S404, the temperature value Ts is determined. In response to the sensed temperature Ts exceeding the first critical temperature TMTU, the procedure proceeds to step S406 to operate the adaptive cooling strategy of this disclosure. The controller 104 alternately enables and disables the first clock generator 106 in an adaptive ratio, to alternately switching between the normal transmission state St and the cooling state Sc in the adaptive ratio. In response to the sensed temperature Ts not exceeding the first critical temperature TMTU, the procedure proceeds to step S408 to compare the sensed temperature Ts with the second critical temperature TM_L and the third critical temperature TM_H. If the sensed temperature Ts does not exceed the second critical temperature TM_L, the procedure proceeds to step S410, and the controller 104 operates the flash memory 102 at high speed according to the first clock Clk1 generated by the first clock generator 106. If the sensed temperature Ts exceeds the second critical temperature TM_L but does not exceed the third critical temperature TM_H, the procedure proceeds to step S412. The controller 104 performs first-level underclocking based on the first clock Clk1 generated by the first clock generator 106. According to the first-level underclocking, the flash memory 102 operates at the third clock Clk3 (70% of the frequency of the first clock Clk1) to respond to the access request issued by the host 112. If the sensed temperature Ts exceeds the third critical temperature TM_H but does not exceed the first critical temperature TMTU, the procedure proceeds to step S414. The controller 104 performs second-level underclocking based on the first clock Clk1 generated by the first clock generator 106. According to the second-level underclocking, the flash memory 102 operates at the fourth clock Clk4 (30% of the frequency of the first clock Clk1) to respond to the access request issued by the host 112.

The above concept may be further used to implement a non-volatile memory control method, which provides a first clock generator 106 and a second clock generator 108 to generate a first clock Clk1 and a second clock Clk2, respectively, to be selected to operate a flash memory 102. The frequency of the second clock Clk2 is lower than that of the first clock Clk1. When the sensed temperature Ts does not exceed the first critical temperature TMTU, the first clock Clk1 is selected to operate the flash memory 102. In response to the sensed temperature Ts exceeding the first critical temperature TMTU, the first clock Clk1 and the second clock Clk2 are alternately selected to operate the flash memory 102. Any architecture involving this adaptive cooling strategy should be regarded as within the scope of this case.

While the disclosure has been described by way of example and in terms of the preferred embodiments, it should be understood that the disclosure is not limited to the disclosed embodiments.

What is claimed is:

1. A data storage device, comprising:
   a non-volatile memory;
   a controller, coupled to the non-volatile memory and configured to operate the non-volatile memory in response to host requests; and
   a first clock generator and a second clock generator, generating a first clock and a second clock, respectively, to be selected by the controller to operate the non-volatile memory, wherein a frequency of the second clock is lower than that of the first clock;
   wherein:
   in response to a sensed temperature not exceeding a first critical temperature, the controller selects the first clock to operate the non-volatile memory; and
   in response to the sensed temperature exceeding the first critical temperature, the controller alternately selects the first clock and the second clock to operate the non-volatile memory.

2. The data storage device as claimed in claim 1, wherein:
   the first clock generator is a phase locked loop circuit, and the second clock generator is an oscillator.

3. The data storage device as claimed in claim 1, wherein:
   in response to the sensed temperature exceeding the first critical temperature, the controller adjusts a time ratio of enabling the first clock and enabling the second clock according to a temperature difference between the sensed temperature and the first critical temperature.

4. The data storage device as claimed in claim 3, wherein:
   when the temperature difference does not reach DT, the controller alternately selects the first clock and the second clock with a time ratio of 1:CD1;
   when the temperature difference reaches DT, the controller selects the first clock and the second clock alternately with a time ratio of 1:CD2;
   wherein DT, CD1 and CD2 are numerical values, and CD1<CD2.

5. The data storage device as claimed in claim 1, wherein:
   when the sensed temperature exceeds a second critical temperature but does not exceed a third critical temperature lower than the first critical temperature, the controller selects a third clock to operate the non-volatile memory.

6. The data storage device as claimed in claim 5, wherein:
   the third clock is generated by underclocking based on the first clock.

7. The data storage device as claimed in claim 6, wherein:
   the third clock is higher than the second clock.

8. The data storage device as claimed in claim 2, further comprising:
   a multiplexer, having input terminals coupled to the first clock generated by the phase locked loop circuit and the second clock generated by the oscillator,
   wherein the multiplexer is controlled by the controller to output either the first clock or the second clock for the controller to operate the non-volatile memory.

9. A control method for a non-volatile memory, comprising:
   generating a first clock and a second clock, respectively, to be selected to operate the non-volatile memory, wherein a frequency of the second clock is lower than that of the first clock;
   obtaining a sensed temperature;
   in response to the sensed temperature not exceeding a first critical temperature, selecting the first clock to operate the non-volatile memory; and

in response to the sensed temperature exceeding the first critical temperature, alternately selecting the first clock and the second clock to operate the non-volatile memory.

10. The control method as claimed in claim 9, further comprising:

operating a phase locked loop circuit to generate the first clock; and operating an oscillator to generate the second clock.

11. The control method as claimed in claim 9, further comprising:

when the sensed temperature exceeds the first critical temperature, adjusting a time ratio of enabling the first clock and enabling the second clock according to a temperature difference between the sensed temperature and the first critical temperature.

12. The control method as claimed in claim 11, further comprising:

when the temperature difference does not reach DT, selecting the first clock and the second clock alternately with a time ratio of 1:CD1;

when the temperature difference reaches DT, selecting the first clock and the second clock alternately with a time ratio of 1:CD2;

wherein DT, CD1 and CD2 are numerical values, and CD1<CD2.

13. The control method as claimed in claim 9, further comprising:

when the sensed temperature exceeds a second critical temperature but does not exceed a third critical temperature lower than the first critical temperature, selecting a third clock to operate the non-volatile memory.

14. The control method as claimed in claim 13, wherein:

the third clock is generated by underclocking based on the first clock.

15. The control method as claimed in claim 14, wherein:

the third clock is higher than the second clock.

* * * * *